United States Patent [19]

Fujii et al.

[11] Patent Number: 6,033,978
[45] Date of Patent: Mar. 7, 2000

[54] PROCESS OF SELECTIVELY PRODUCING REFRACTORY METAL SILICIDE UNIFORM IN THICKNESS REGARDLESS OF CONDUCTIVITY TYPE OF SILICON THEREUNDER

[75] Inventors: Kunihiro Fujii; Hirohito Watanabe, both of Tokyo, Japan

[73] Assignee: NEC Corporation, Tokyo, Japan

[21] Appl. No.: 08/754,519

[22] Filed: Nov. 21, 1996

Related U.S. Application Data

[63] Continuation of application No. 08/498,131, Jul. 5, 1995, abandoned.

[30] Foreign Application Priority Data

Jul. 5, 1994 [JP] Japan ........................ 6-153200
May 31, 1995 [JP] Japan ........................ 7-133707

[51] Int. Cl.[7] ................ H01L 21/4763; H01L 21/44; H01L 21/3205
[52] U.S. Cl. .............. 438/621; 438/655; 438/656; 438/657; 438/592
[58] Field of Search ................ 438/621, 655, 438/656, 657, 586, 592, 664, 659

[56] References Cited

U.S. PATENT DOCUMENTS

| | | | |
|---|---|---|---|
| 4,648,175 | 3/1987 | Metz, Jr. et al. | 29/589 |
| 4,683,645 | 8/1987 | Naquib et al. | 437/41 |
| 4,777,150 | 10/1988 | Deneuville et al. | 437/200 |
| 4,835,112 | 5/1989 | Pfiester et al. | 437/41 |
| 4,920,073 | 4/1990 | Wei et al. | 438/655 |
| 4,939,567 | 7/1990 | Kenney | 357/42 |
| 4,977,098 | 12/1990 | Yu et al. | 437/200 |
| 5,393,676 | 2/1995 | Anjum et al. | 437/46 |
| 5,428,234 | 6/1995 | Sumi | 257/287 |
| 5,444,024 | 8/1995 | Anjum et al. | 437/41 |
| 5,545,574 | 8/1996 | Chen et al. | 437/40 |
| 5,593,924 | 1/1997 | Apte et al. | 438/647 |

FOREIGN PATENT DOCUMENTS

| | | |
|---|---|---|
| 60-193380 | 10/1985 | Japan . |
| 2-45923 | 2/1990 | Japan . |
| 3209834 | 9/1991 | Japan . |
| 5036632 | 2/1993 | Japan . |
| 2214708 | 9/1989 | United Kingdom . |

OTHER PUBLICATIONS

D. K. Kwong et al., "Silicided shallow junction formation . . . drive–in", *J. Appl. Phys.*, vol. 61, No. 11, Jun. 1, 1987, pp. 5084–5088.

Nobutoshi Aoki et al., "Anomalous diffusion of lightly . . . Si substrate during $N_2$ annealing", *Appl. Phys. Lett.*, vol. 64, No. 32, Jun. 6, 1994, pp. 3133–3135.

Primary Examiner—Richard Booth
Assistant Examiner—Ha Tran Nguyen
Attorney, Agent, or Firm—Sughrue, Mion, Zinn, Macpeak & Seas, PLLC

[57] ABSTRACT

Amorphous silicon layers are formed on an n-type single-crystal/poly-crystal layer and a p-type single-crystal/poly-crystal layer, and titanium is sputtered on the amorphous silicon layers; although the n-type dopant impurity are piled on the n-type single-crystal/poly-crystal layers, the amorphous silicon layers takes the piles of n-type dopant impurity thereinto, and promote the silicidation of the titanium layer.

21 Claims, 10 Drawing Sheets

PROCESS OF SELECTIVELY PRODUCING REFRACTORY METAL SILICIDE UNIFORM IN THICKNESS REGARDLESS OF CONDUCTIVITY TYPE OF SILICON THEREUNDER

This is a Continuation of application Ser. No. 08/498,131 filed Jul. 5, 1995, now abandoned.

FIELD OF THE INVENTION

This invention relates to a semiconductor device fabrication technology and, more particularly, to a process of selectively fabricating a refractory metal silicide uniform in thickness regardless of the conductivity type of a silicon layer thereunder.

DESCRIPTION OF THE RELATED ART

Titanium silicide has the lowest electric resistivity among the refractory metal silicide, and is attractive for a semiconductor device manufacturer. FIGS. 1A to 1D illustrate a typical example of the process of forming titanium silicide layers. The process starts with preparation of a p-type silicon substrate 1, and an n-type well 2 is formed in a surface portion of the p-type silicon substrate 1. A field oxide layer 3 is selectively grown on the major surface of the p-type silicon substrate 1 through the local-oxidation-of-silicon technique, and the p-type surface portion of the silicon substrate 1 and the n-type well 2 are assigned to an n-channel type field effect transistor and a p-channel type field effect transistor, respectively.

Silicon oxide layers are grown on the surface portion of the p-type silicon substrate 1 and the surface portion of the n-type well 2, respectively, and doped polysilicon layer is deposited over the entire. surface of the structure. N-type dopant impurity such as arsenic or phosphorus is doped in the doped polysilicon layer.

An appropriate mask (not shown) is patterned on the doped polysilicon layer, and the doped polysilicon layer and the silicon oxide layers are patterned by using a dry etching. The mask is removed from the structure, and doped polysilicon gate electrodes 4a and 4b on gate oxide films 5a and 5b are left in the surface portion of the p-type silicon substrate 1 and the surface portion of the n-type well 2.

A mask (not shown) is provided over the n-type well 2, and lightly doped n-type source and drain regions 6a are formed in the surface portion of the p-type silicon substrate 1 through an ion implantation of n-type dopant impurity such as the arsenic or the phosphorous. The mask is stripped off, and another mask is provided over the surface portion of the p-type silicon substrate 1. Using the mask, p-type dopant impurity is ion implanted into the n-type well 2, and lightly doped p-type source and drain regions 6b are formed in the n-type well 2.

Silicon oxide or silicon nitride is deposited over the entire surface of the structure, and the silicon oxide layer or the silicon nitride layer is formed into side walls 7a and 7b on the side surfaces of the gate electrodes 4a and 4b, respectively, by using an etch-back. The gate oxide film 5a/5b, the gate electrode 4a/4b and the side walls 7a/7b as a whole constitute a gate structure. The resultant structure of this stage is illustrated in FIG. 1A.

A mask (not shown) is provided on the structure, again, and exposes the gate structure and the surface portion of the p-type silicon substrate 1. The n-type dopant impurity is ion implanted into the surface portion, and heavily doped source and drain regions 8a are formed in the surface portion on both sides of the gate structure. The heavily-doped source and drain regions 8a are overlapped with the lightly doped source and drain regions 6a, and form the LDD (Lightly-Doped-Drain) structure.

The mask is stripped off, and another mask (not shown) exposes the n-type well 2. The p-type dopant impurity is/introduced into the surface portion of the n-type well 2 on both sides of the gate structure, and heavily doped p-type source and drain regions 8b are overlapped with the lightly doped p-type source and drain regions 6b, respectively. The LDD structure is formed on both sides of the gate structure.

Natural oxide films cover exposed surfaces of the gate electrodes 4a and 4b, exposed surfaces of the heavily doped n-type source and drain regions 8a and exposed surfaces of the heavily doped p-type source and drain regions 8b, and are removed therefrom through an etching.

Subsequently, titanium is sputtered onto the entire surface of the structure without heating the substrate 1, and a titanium layer 9 covers the entire surface of the structure as shown in FIG. 1B.

The structure shown in FIG. 1B is placed in nitrogen atmosphere, and the titanium layer 9 is subjected to a rapid thermal annealing at not higher than 700 degrees in centigrade.

Then, the titanium layer 9 held in contact with the silicon is converted to titanium disilicide with C49 phase, and the gate electrodes 10a/10b, the heavily doped n-type source and drain regions 8a and the heavily doped p-type source and drain regions 8b are overlain by the titanium silicide layers 10a/10b, 10c/10d and 10e/10f. The other titanium layer 9 reacts with the nitrogen, and is converted to titanium nitride. For this reason, the field oxide layer 3 and the side walls 7a and 7b are covered with the titanium nitride layer 11 as shown in FIG. 1C. Etching solution containing ammonia and hydrogen peroxide selectively removes the titanium nitride, and the titanium silicide layers 10a to 10f are exposed. A rapid thermal annealing at higher temperature converts the titanium disilicide to titanium disilicide with C54 phase lower in electric resistivity than the titanium silicide, and the gate electrodes 4a/4b, the heavily doped n-type source and drain regions 8a and the heavily doped p-type source and drain regions 8b are overlain by the titanium disilicide layers 12a to 12f as shown in FIG. 1D.

Thus, the titanium disilicide layers 12a to 12f are provided on the top surfaces of the gate electrodes 4a/4b, the exposed surfaces of the heavily doped n-type source and drain regions 8a and the exposed surfaces of the heavily doped p-type source and drain regions 8b in the self-aligned manner. The titanium disilicide layers 12a to 12f decrease the electrical resistances of the signal paths, and the signal propagations are speed-up.

However, the titanium disilicide layers 12a to 12f produced through the prior art process encounter a problem in that the titanium disilicide layers 12a to 12d on the n-type silicon layers/regions are twice as large in sheet resistance than the titanium disilicide layers 12e and 12f on the p-type silicon regions 8b.

While the titanium layer is being converted to a titanium disilicide layer with C49 phase, silicon atoms are diffused into the titanium layer, and convert the titanium into the titanium disilicide.

If arsenic or phosphorus are heavily doped into a single crystal silicon layer or a polysilicon layer, excess arsenic or excess phosphorus over the solubility tends to be piled on the surface of the single crystal silicon layer or the polysilicon layer, and forms a barrier against the silicon atoms diffused into the titanium layer. However, this phenomenon does not take place in the boundary between the p-type silicon region and the titanium layer. As a result, the excess arsenic or the excess phosphorus decelerates the silicide process over the n-type silicon region/layer, and the titanium silicide layer on the n-type silicon region/layer is thinner than the titanium silicide layer on the p-type silicon region.

Titanium disilicide layers on the n-type/p-type silicon layers were evaluated as follows. Titanium layers of 35 nanometers thick were deposited on an n-type silicon layer and a p-type silicon layer, and a rapid thermal annealing at 650 degrees centigrade converted the titanium layers to titanium disilicide layers with C49 phase. Titanium nitride was etched away, and a rapid thermal annealing at 850 degrees centigrade converted the titanium silicide layers to titanium disilicide layers with C54 phase. The present inventor measured the thicknesses of the titanium disilicide layers, and found that the titanium disilicide on the n-type silicon layer was tens percent of the titanium disilicide of the order of 50 nanometers thick on the p-type silicon layer. The present inventor further measured the sheet resistance, and confirmed that the sheet resistance of the titanium disilicide layer on the n-type silicon layer was twice as large as the sheet resistance of the titanium disilicide on the p-type silicon layer. Undesirable agglomeration took place in the thin titanium disilicide layer during the second rapid thermal annealing, and degraded the reliability of the circuit component. On the other hand, the titanium disilicide layer on the p-type silicon layer was so thick that the parasitic resistance and the junction leakage were increased. Thus, the titanium disilicide layers produced through the prior art process are different in thickness depending upon the conductivity type of the silicon layer reacting with the titanium.

If the silicon substrate is heated to the temperature for producing the titanium disilicide during a sputtering of titanium, the silicidation is accelerated on the n-type silicon region/layer, and the titanium disilicide layers become uniform in thickness regardless of the conductivity type of the silicon region/layer. However, the silicidation at the high temperature destroys the selectivity, and titanium silicide layers are produced on not only the silicon layer/region but also silicon oxide layers such as the side walls 7a and 7b. The etching can not remove titanium disilicide layers on the side walls 7a/7b. This results in undesirable short-circuit between the gate electrodes 4a/4b and the source and drain regions 8a/8b.

Japanese Patent Publication of Unexamined Application No. 2-45923 teaches a solution of the destruction of the selectivity. In detail, if cobalt or nickel is used as the refractory metal instead of the titanium, a silicidation takes place at the boundary between the cobalt/nickel and silicon only. As described hereinbefore, if the titanium is used as the refractory metal, the silicon atoms are diffused into the titanium during the silicidation, and the silicon oxide also supplies the silicon atoms into the titanium.

On the other hand, the cobalt atoms or the nickel atoms are diffused into the silicon during the silicidation at a high temperature for the disilicide. As a result, the silicidation takes place at the boundary between the cobalt/nickel and the silicon only. However, the cobalt disilicide and the nickel disilicide are higher in resistivity than the titanium disilicide, and hardly accelerate a signal propagation along the cobalt disilicide/nickel disilicide.

Another approach against the irregular thickness is disclosed in Journal of Applied Physics, 1987, pages 5084 to 5088. According to the paper, the silicidation is carried out before an introduction of dopant impurities. Namely, titanium is deposited over silicon regions, and the titanium layer is selectively converted into titanium disilicide layers. Thereafter, an n-type dopant impurity and a p-type dopant impurity are selectively ion implanted through the titanium disilicide layers into the silicon regions. In this process, the silicidation is not affected by the conductivity type of the silicon regions, and the titanium disilicide layers become uniform in thickness.

However, the ion implantation requires an activation of the dopant impurities at 900 degrees centigrade, and the titanium disilicide tends to agglomerate during the high temperature activation stage. As a result, the titanium disilicide insufficiently improves the resistance of the laminated wiring.

Moreover, the rough surfaces of the titanium disilicide layers and irregularity of the film thickness vary the projected range of the implanted dopant impurities, and deform the impurity profiles. The implanted dopant impurities are causative of knock-on effect, and the knock-on effect results in irregular electric properties and a large amount of leakage current.

SUMMARY OF THE INVENTION

It is therefore an important object of the present invention to provide a process of producing a refractory metal silicide which produces a titanium disilicide layer on an n-type silicon region equal in thickness to a disilicide layer on a p-type silicon region without destruction of selectivity.

To accomplish the object, the present invention proposes to take piles of excess dopant impurity into an amorphous silicon layer.

In accordance with the present invention, there is provided a process of producing refractory metal disilicide layers, comprising the steps of: preparing a semiconductor structure having a first silicon portion doped with a p-type impurity and a second silicon portion doped with an n-type impurity; forming amorphous silicon layers on the first silicon portion and the second silicon portion; maintaining the semiconductor structure at a first temperature lower than a second temperature for producing a refractory metal disilicide and a third temperature for crystallizing the amorphous silicon of the amorphous silicon layers; depositing a refractory metal layer on at least the amorphous silicon layers so as to form mixed boundary layers containing the refractory metal and the amorphous silicon between the first and second portions and the refractory metal layer; and heating the mixed boundary layers to a fourth temperature not lower than the second temperature and the third temperature for producing refractory metal disilicide layers on the first and second portions.

BRIEF DESCRIPTION OF THE DRAWINGS

The features and advantages of the process of producing a refractory metal disilicide according to the present invention will be more clearly understood from the following description taken in conjunction with the accompanying drawings in which.

DESCRIPTION OF THE PREFERRED EMBODIMENTS

First Embodiment

Figure 1A:
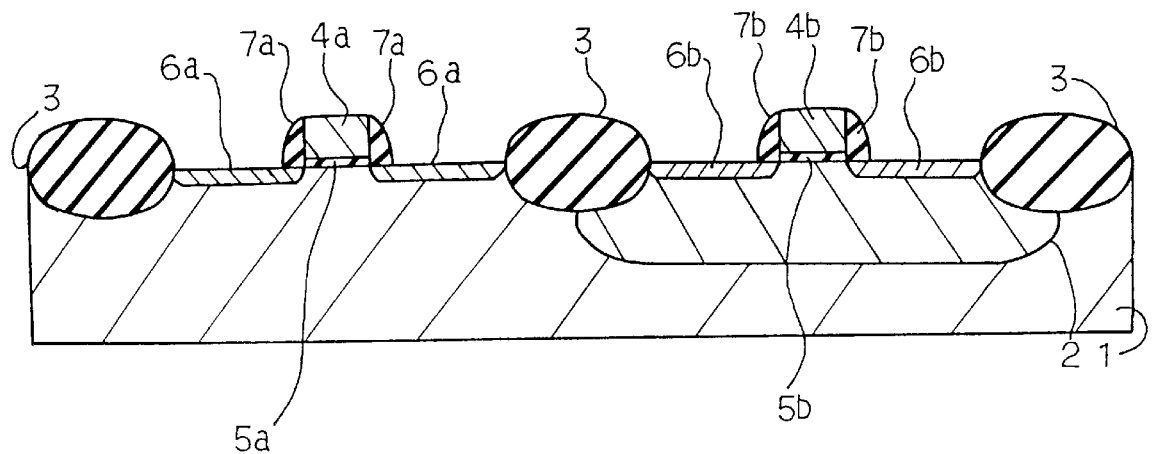
FIGS. 1A to 1D are cross sectional views showing the prior art process sequence for producing the titanium disilicide layers.
Figure 1B:
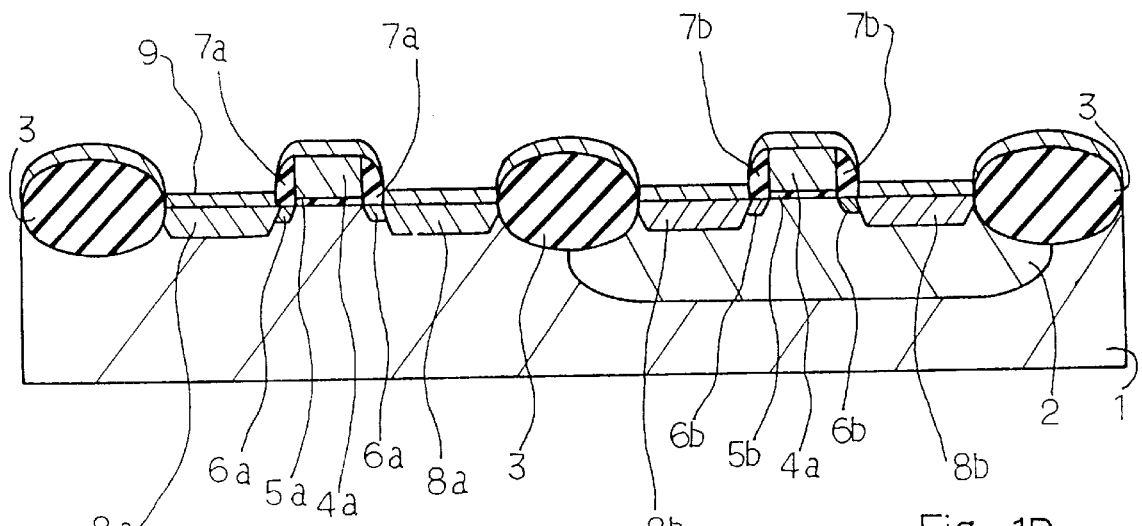
Figure 1C:
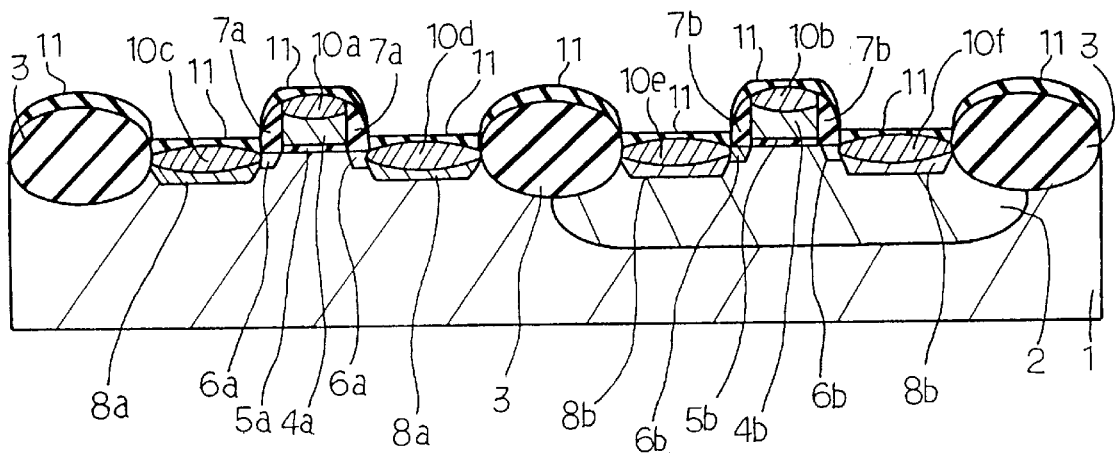
Figure 1D:
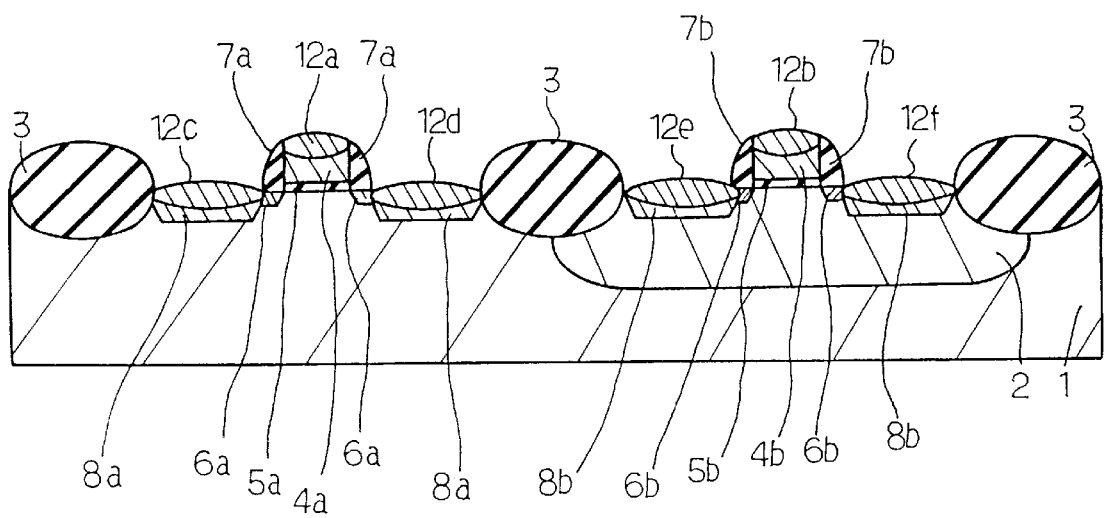

Referring to FIGS. 2A to 2D of the drawings, a process of producing a refractory metal disilicide embodying the present invention starts with preparation of a p-type single crystal silicon substrate 21, and the p-type single crystal silicon substrate 21 is partially doped with an n-type dopant impurity through an ion-implantation so as to form an n-type well 22.

A field oxide layer 23 is selectively grown in a surface portion of the substrate 21 to 360 nanometers thick through the local-oxidation-of-silicon, and defines active device areas assigned to an n-channel type field effect transistor and a p-channel type field effect transistor.

The p-type single crystal silicon substrate 21 is placed in an oxidation atmosphere, and silicon oxide is grown on the active device areas to 10 nanometers thick.

Subsequently, polysilicon is deposited on the entire surface of the structure to 150 nanometers thick by using a chemical vapor deposition, by way of example. As a result, a polysilicon layer (not shown) is respectively laminated on silicon oxide layers (not shown) over the active device areas.

A photo-resist layer (not shown) is patterned into a mask (not shown) covering parts of the polysilicon layer for gate electrodes, and the polysilicon layer and the silicon oxide layers are partially removed by using a dry etching technique. As a result, gate insulating layers 24a/24b overlain by gate electrodes 25a/25b are formed on the active device areas.

A photo-resist layer (not shown) is patterned into a mask (not shown) exposing the active device area assigned to the n-channel type field effect transistor, and an n-type dopant impurity is ion implanted into the active device area so as to form lightly doped n-type source/drain regions 26a. The ion-implanted n-type impurity is also introduced into the gate electrode 25a. The mask (not shown) is stripped off.

A photo-resist layer (not shown) is patterned into a mask (not shown) exposing the active device area assigned to the p-channel type field effect transistor, and a p-type dopant impurity is introduced into the exposed n-type well 22 and the gate electrode 25b by using the ion-implantation. Lightly doped p-type source/drain regions 26b are formed in the n-type well 22, and the gate electrode 25b is doped with the p-type dopant impurity. Thereafter, the mask (not shown) is removed.

Figure 2A:
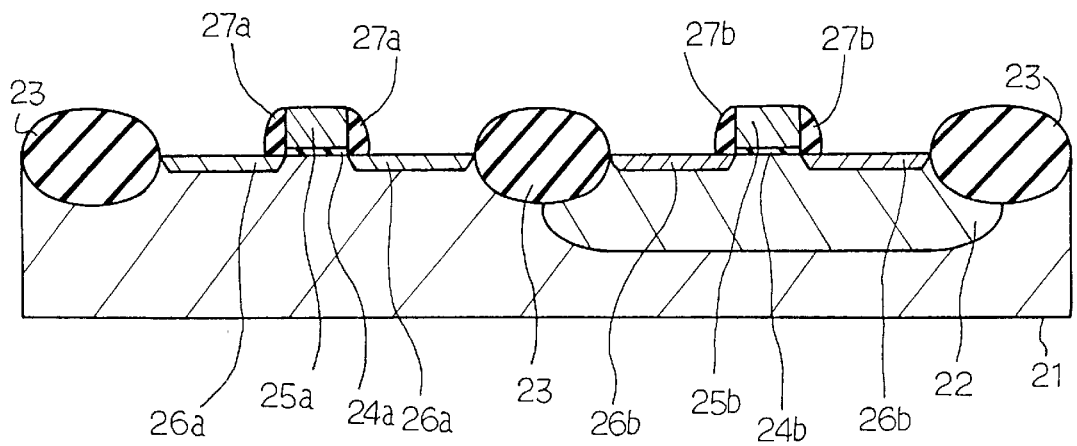
FIGS. 2A to 2D are cross sectional view showing a process sequence according to the present invention.

Silicon oxide is deposited over the entire surface to 70 nanometers thick, and the silicon oxide layer (not shown) is shaped into side walls 27a and 27b by using an etch-back. The gate insulating layers 24a/24b, the gate electrodes 25a/25b and the side walls 27a/27b form in combination gate structures for the field effect transistors as shown in FIG. 2A.

A photo-resist layer (not shown) is patterned into a mask (not shown) exposing the active device area assigned to the n-channel type field effect transistor, and an n-type dopant impurity is ion implanted into the active device area so as to form heavily doped n-type source/drain regions 28a. The heavily-doped n-type source/drain regions 28a are respectively overlapped with the lightly-doped n-type source/drain regions 28b, and form the LDD structure. The ion-implanted n-type impurity is also heavily introduced into the gate electrode 25a. The mask (not shown) is stripped off.

Similarly, a photo-resist layer (not shown) is patterned into a mask (not shown) exposing the active device area assigned to the p-channel type field effect transistor, and a p-type dopant impurity is heavily introduced into the exposed n-type well 22 and the gate electrode 25b by using the ion-implantation. Heavily doped p-type source/drain regions 28b are formed in the n-type well 22, and are overlapped with the lightly doped n-type source/drain regions 26b. Thus, the LDD structure is also formed for the source and drain regions of the p-channel type field effect transistor. The gate electrode 25b is heavily doped with the p-type dopant impurity. The mask (not shown) is removed.

After the ion-implantation, the n-type dopant impurity and the p-type dopant impurity are activated in nitrogen atmosphere at 900 degrees centigrade for 20 minutes. The single crystal silicon substrate is cured from the damage due to the ion-implantation.

Subsequently, arsenic is ion implanted into the heavily doped n-type source/drain regions 28a, the heavily doped p-type source/drain regions 28b and the gate electrodes 25a/25b at dose of $3.0 \times 10^{14}$ cm$^{-2}$ under acceleration energy of 30 KeV. The accelerated arsenic converts surface portions of the heavily doped n-type source/drain regions 28a, surface portions of the heavily doped p-type source/drain regions 28b and top surface portions of the gate electrodes 25a/25b into amorphous silicon. In this instance, the amorphous silicon layers 29a to 29f are 30 nanometers deep.

In this instance, the arsenic is ion implanted. However, another heavy element such as $BF_2$ is available for forming the amorphous silicon layers 29a to 29f. Alternatively, the amorphous silicon layers may be formed by using a reverse sputtering, i.e., a bombardment of argon ion.

Although the arsenic is introduced into the heavily doped p-type source/drain regions 28b, the introduced arsenic does not change the conductivity type of the source and drain regions of the p-channel type field effect transistor, because the arsenic concentration is much smaller than the p-type dopant impurity concentration.

Subsequently, natural oxide films grown on the exposed silicon surfaces are etched away in dilute hydrofluoric acid. Thereafter, the p-type single crystal silicon substrate 21 is heated to 450 degrees centigrade, and titanium is sputtered on the entire surface to 30 nanometers thick.

The substrate temperature is lower than a critical temperature for titanium disilicide and a critical temperature for solid-phase growth of silicon. The critical temperature for the titanium disilicide is around 500 degrees centigrade, and the critical temperature for the solid-phase growth is also around 500 degrees centigrade. For this reason, it is required to maintain the p-type single crystal silicon substrate 21 at equal to or less than 500 degrees centigrade.

The titanium is mixed with the amorphous silicon, and mixed boundary layers 30a to 30f are formed between the amorphous layers 29a to 29f and the titanium layer 31. The n-type dopant impurity coagulated on the heavily doped source/drain regions 28a/28b is taken into the mixed boundary layers 30a to 30f.

The substrate temperature is lower than the critical temperature for the titanium disilicide, and, accordingly, the diffusion of silicon is ignoreable. For this reason, a titanium disilicide layer is never formed on the side walls 27a and 27b, and a short circuit does not take place between the gate electrodes 25a/25b and the source/drain regions 28a/28b.

Figure 2B:
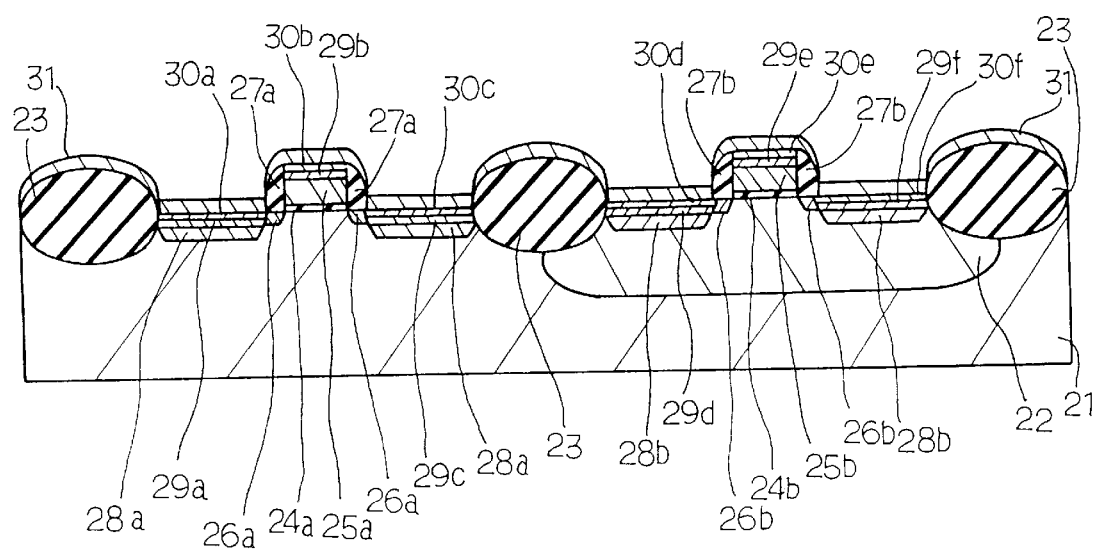

The sputtering is carried out at a deposition speed equal to or less than 2 nanometer/second, and the low sputtering speed increases the depth of the mixed boundary layers 30a to 30f. In this instance, the mixed boundary layers 30a to 30f are 6 nanometers in depth. The resultant structure of this stage is illustrated in FIG. 2B.

As reported by Applied Physical letters, 1994, pages 3133 to 3135, the piles of the dopant impurity are of the order of 5 nanometers, and the mixed boundary layers 30a to 30f of 6 nanometers in depth, perferably are thick enough to take the piles of impurity thereinto. Therefore, it is recommendable to form the mixed boundary layers 30a to 30f deeper than 5 nanometers.

Figure 2C:
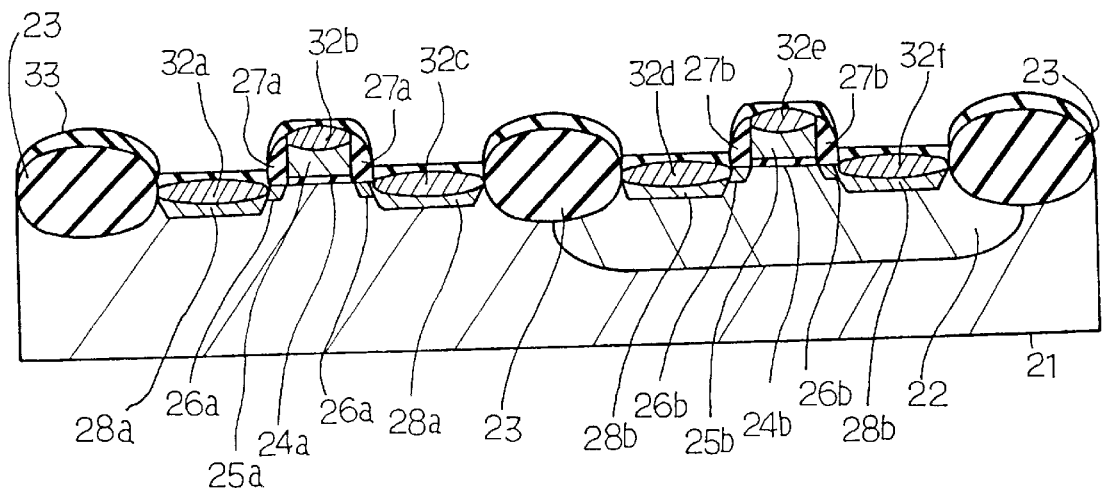

The p-type single crystal silicon substrate 21 is placed in nitrogen atmosphere, and the titanium layer is heated to 650 degrees centigrade for 30 seconds by using a rapid thermal annealing technique. The titanium layer 31 is selectively converted to titanium disilicide layers 32a to 32f. The remaining titanium layer 31 reacts with the nitrogen, and is converted to a titanium nitride layer 33 as shown in FIG. 2C. The titanium layer 31 on the field oxide layer 23 and the side walls 27a/27b is converted to the titanium nitride. As a result, a short-circuit does not take place between the gate electrodes 25a/25b and the source/drain regions 28a/28b.

Even if the n-type dopant impurity is piled on the heavily doped n-type source/drain regions 29a and the gate electrode 25a, the n-type dopant impurity is taken into the mixed boundary layers 29a to 29c under the heating of the p-type single crystal silicon substrate 21, and the boundaries between the mixed boundary layers 30a to 30f and the titanium layer 31 are cleared of piled dopant impurity. For this reason, the silicidation smoothly proceeds, and the titanium disilicide layers 32a to 32f are roughly equal in thickness to one another regardless of the conductivity type of the single crystal/poly-crystal silicon.

If the titanium is sputtered without heating the p-type single crystal silicon substrate 21, natural oxide impedes the silicidation. However, the p-type single crystal silicon substrate 21 heated below the critical temperatures is prevented from the undesirable natural oxide, and the heating below the critical temperatures enhances the reliability of the process.

Figure 2D:
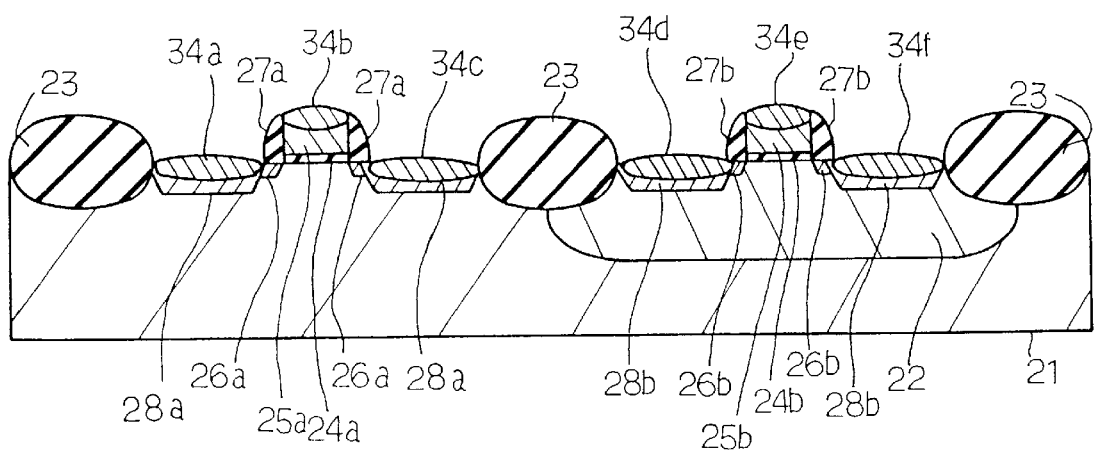

Subsequently, the titanium nitride and residue of titanium are selectively etched away in solution of ammonia and hydrogen peroxide, and the titanium disilicide layers 32a to 32f are converted to titanium disilicide layers 34a to 34f lower in resistivity than the titanium disilicide layers 32a to 32f through a rapid thermal annealing in nitrogen atmosphere at 850 degrees centigrade for 10 seconds. The resultant structure of this stage is illustrated in FIG. 2D.

The sheet resistance of the titanium disilicide layers 34a/34c and 34d/34f and the sheet resistance of the titanium disilicide layers 34b and 34e were measured. The heavily doped n-type source/drain regions 28a and the heavily doped p-type source/drain regions 28b were 0.4 micron in width, and the gate electrodes 25a and 25b were 0.2 micron in width. The sheet resistance was 6.2 ohm per square on the heavily doped n-type source/drain region 28a, 5 ohm per square on the heavily doped p-type source/drain region 28b, 5.2 ohm per square on the n-type polysilicon gate electrode 25a and 4.1 ohm per square on the p-type polysilicon gate electrode 25b. The difference of the resistivity between the conductivity types was smaller than those of the prior art.

The rapid thermal annealing homogenously transfers C49 structure of the high-resistive titanium disilicide to C54 structure of the low-resistive titanium disilicide, and the surfaces of the titanium disilicide layers are good. The smooth silicidation at the previous stage is believed to enhance the phase transition and to be conducive to the good surfaces.

Figure 3:
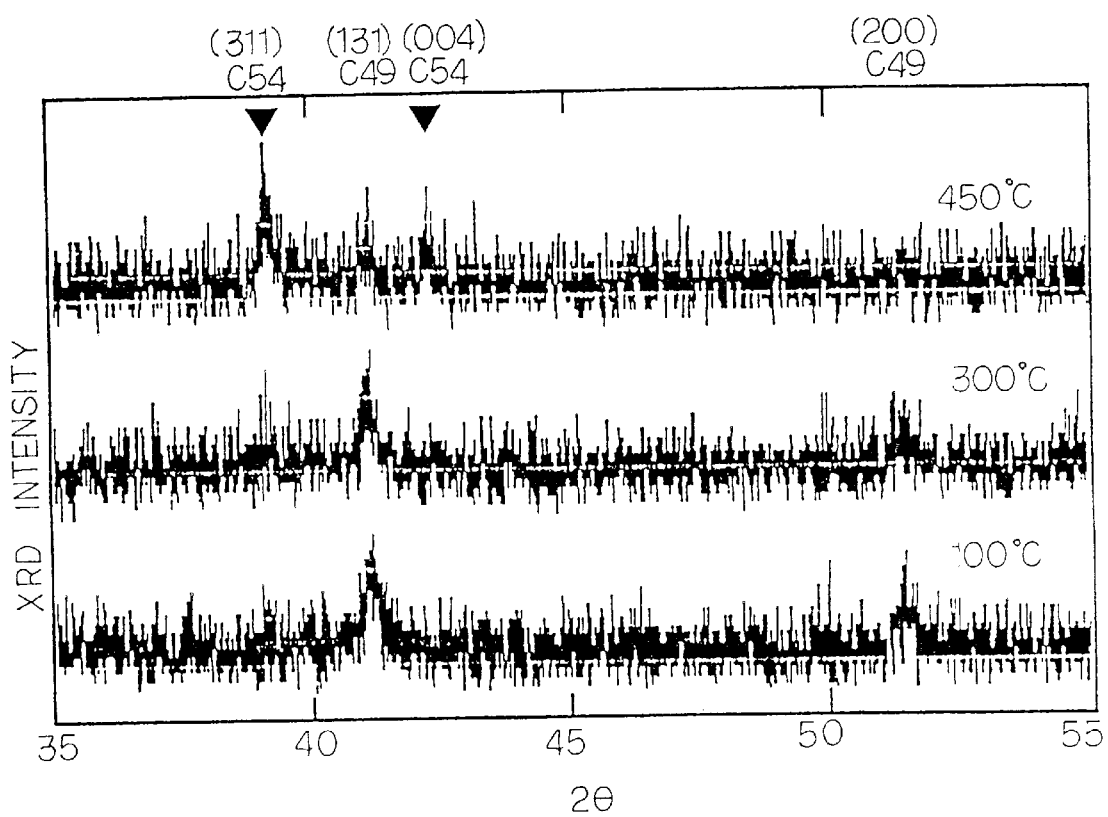
FIG. 3 is a graph showing x-ray diffraction patterns of titanium silicide layers converted at different substrate temperatures.

The substrate temperature was evaluated during the sputtering of the titanium target. Amorphous silicon layers were formed on single crystal silicon substrates. The substrate temperature was adjusted to 100 degrees centigrade, 300 degrees centigrade and 450 degrees centigrade. The titanium layers were deposited on the amorphous silicon layers in the nitrogen atmosphere at the different substrate temperatures, and were subjected to the rapid thermal annealing at 650 degrees centigrade for 30 seconds. The titanium layers were partially converted to the titanium disilicide and partially to the titanium nitride, and the titanium nitride was etched away. The titanium disilicide layers were analyzed by using an x-ray diffraction system, and FIG. 3 shows the x-ray diffraction data representing the phase structure of the titanium disilicide layers.

Only the high-resistive phase or C49 structure was observed in the titanium disilicide layer produced through the sputtering at 100 degrees centigrade. On the other hand, the low-resistive phase or C54 structure was observed in the titanium disilicide produced through the sputtering at 300 degrees centigrade, and the low-resistive phase C54 formed large part of the titanium disilicide produced through the sputtering at 450 degrees. Thus, a higher substrate temperature within the temperature range of the present invention is desirable in view of the phase transfer.

The desirable substrate temperature was confirmed through a measurement of the sheet resistance. The substrate temperature was varied from 100 degrees centigrade to 450 degrees centigrade during the sputtering of the titanium, and measured the sheet resistance of the titanium disilicide layers on the heavily doped n-type region, the heavily doped p-type region, the n-type polysilicon gate electrode and the p-type polysilicon gate electrode. The heavily doped n-type/p-type regions were 0.4 micron in width, and the n-type/p-type polysilicon gate electrodes were 0.2 micron in width.

Figure 4A:
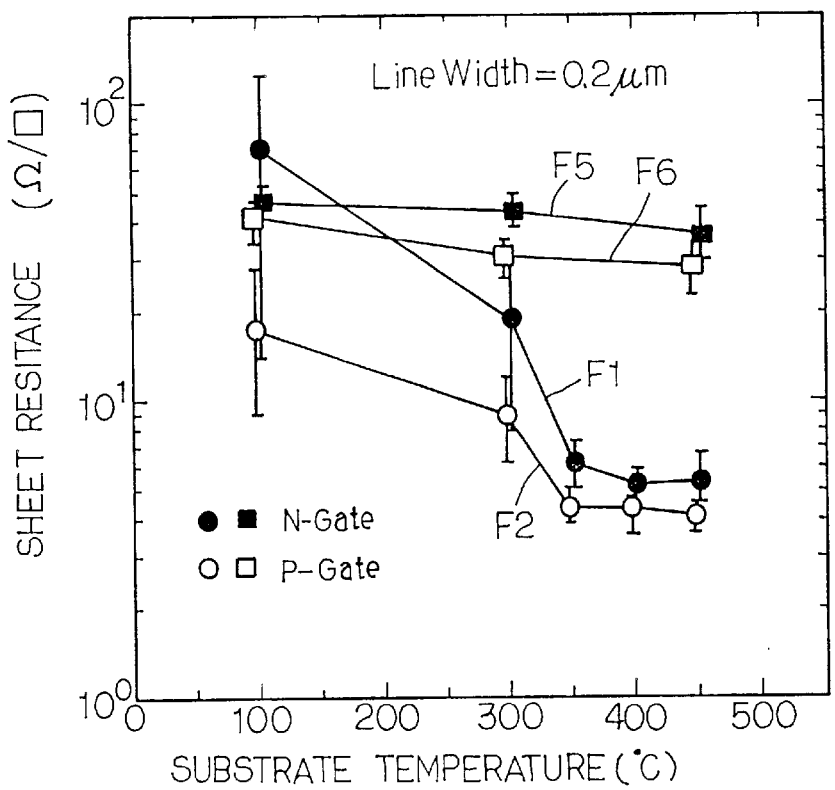
FIGS. 4A and 4B are graphs showing sheet resistance in terms of substrate temperature.
Figure 4B:
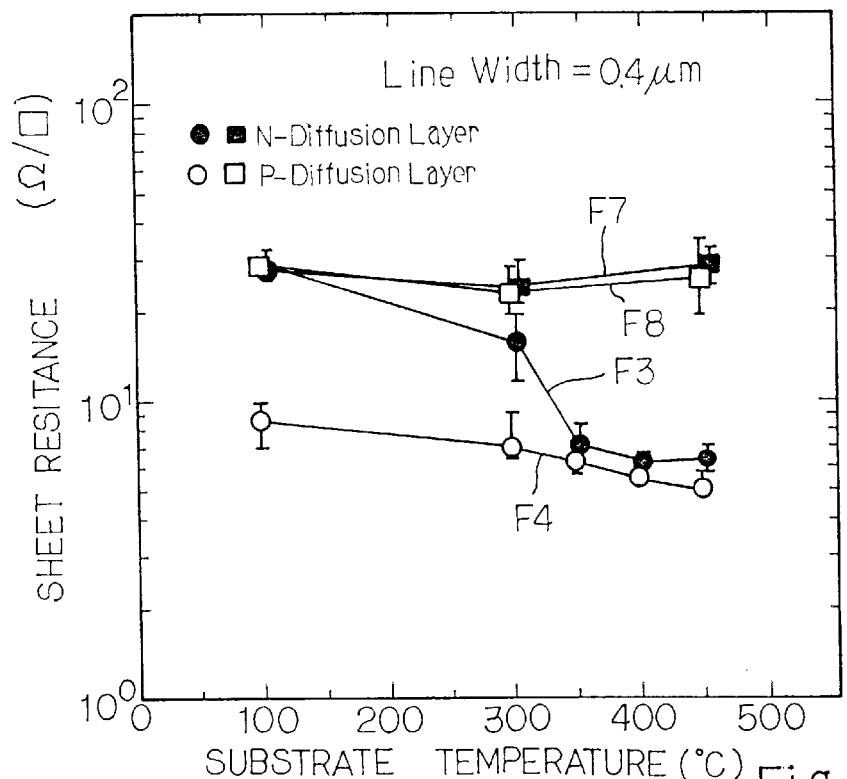

The sheet resistance was plotted in FIGS. 4A and 4B. Plots F1, F2, F3 and F4 represent the sheet resistances of the titanium disilicide layers sputtered on amorphous silicon layers according to the present invention, and Plots F5, F6, F7 and F8 are indicative of the sheet resistances of the titanium disilicide layers directly sputtered on single crystal silicon layers.

The sheet resistance represented by Plots F1 to F4 was drastically decreased at 300 degrees centigrade, and was not widely changed after 350 degrees centigrade. The variation of the sheet resistance was matched with the tendency of the phase transfer shown in FIG. 3. However, the sheet resistance represented by Plots F5 to F8 was substantially constant regardless of the substrate temperature, and it was understood that the amorphous silicon layers and the appropriate substrate temperature promoted the phase transfer of the titanium disilicide layers.

As described hereinbefore, the upper limit of the substrate temperature for the titanium is around 500 degrees centigrade in view of the restriction of the titanium disilicide and the crystallization of the amorphous silicon. The phase transfer limits the recommendable substrate temperature, and the lower limit of the recommendable temperature range is around 300 degrees centigrade in view of the resistivity of the titanium disilicide layer. Thus, it is recommendable to maintain the single crystal silicon substrate 21 between 300 degrees centigrade and 500 degrees centigrade.

In the above described embodiment, the titanium layer 31 is deposited to 30 nanometers thick. However, a two-level structure of titanium and titanium nitride may be provided over the entire surface of the structure. When the two-level structure had a titanium layer of 25 nanometer thick and a titanium nitride layer of 30 nanometers, the titanium disilicide layers produced from the two-level structure were 4.7 ohm per square on an n-type single crystal impurity region, 4.3 ohm per square on a p-type single crystal impurity region, 4.7 ohm per square on an n-type polysilicon gate electrode and 4 ohm per square on a p-type polysilicon gate electrode.

The titanium nitride of the two-level structure aims at preventing the titanium from reaction with another substance except for the silicon, and, for this reason, any substance hardly react with titanium is available for the top layer of the two-level structure. Nevertheless, the titanium nitride layer is desirable, because the titanium nitride is etched away together with residual titanium in the wet etching. In other words, the titanium nitride layer does not complicate the process sequence.

As to the deposition stage of the titanium, it is preferable to use a deposition system capable of accelerating deposition particles of large energy ranging from 1 eV to 10 eV. A dc discharging-type magnetron sputtering system, an rf discharging type magnetron sputtering system and an ECR sputtering system are appropriate for the titanium sputtering.

Although the titanium is used as the refractory metal in the above described embodiment, other metals such as, for example, zirconium, hafnium, tungsten, molybdenum and chromium are available, and the range of the substrate temperature is depending upon the refractory metal.

As will be appreciated from the foregoing description, the amorphous silicon layers 29a to 29c remove the undesirable influences of the piles of the n-type dopant impurity from the silicidation, and the titanium disilicide layers 34a to 34f are roughly equal in thickness to one another regardless of the conductivity type of the silicon region/layer. The deposition of the titanium is carried out below the critical temperature for the titanium disilicide, and a titanium disilicide layer is not produced on the side walls 27a/27b. For this reason, the gate electrodes 25a/25b are never short circuited with the source/drain regions 28a/28b.

Second Embodiment

FIGS. 5A to 5E illustrate another process sequence embodying the present invention. The process starts with preparation of a p-type single crystal silicon substrate 41, and an n-type well 42 is formed through an ion-implantation. The n-type well 42 is assigned to a p-channel type field effect transistor.

A field oxide layer 43 is selectively grown on the surface of the p-type single crystal silicon substrate 41 to 360 nanometers thick, and a surface portion of the p-type single crystal silicon substrate 41 is assigned to an n-channel type field effect transistor.

Gate insulating layers 44a and 44b of silicon oxide are grown on the exposed surfaces to 10 nanometer thick, and polysilicon is deposited over the entire surface of the structure to 150 nanometers thick. The polysilicon layer is patterned to gate electrodes 45a and 45b by using lithographic techniques and a dry etching technique.

N-type lightly doped source/drain regions 46a and p-type lightly doped source/drain regions 46b are successively formed in the surface portion of the p-type single crystal silicon substrate 41 and the n-type well 42 in a self-aligned manner with the gate electrodes 45a and 45b by using the lithographic techniques and the ion-implantation.

Figure 5A:
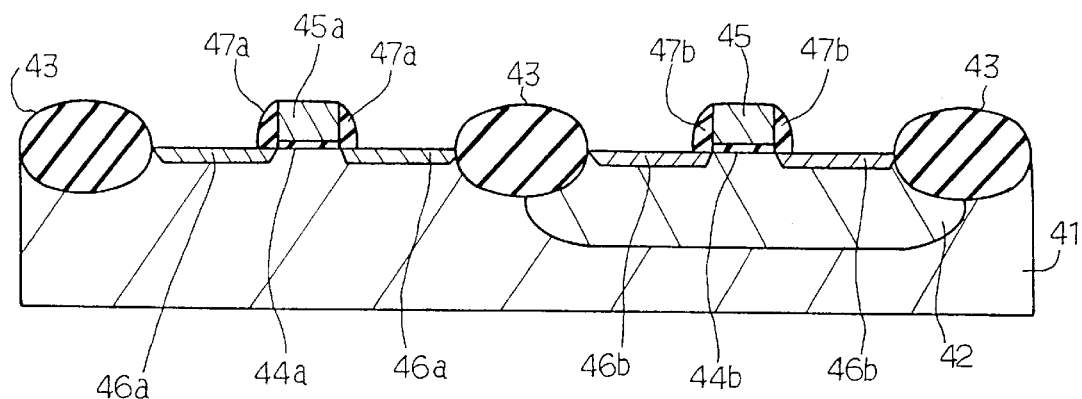
FIGS. 5A to 5E are cross sectional views showing another process sequence according to the present invention.

Silicon oxide is deposited to 70 nanometers thick over the entire surface of the structure, and the silicon oxide layer is formed into side walls 47a and 47b on the side surfaces of the gate electrodes 45a and 45b by using an etch-back technique. The resultant structure is illustrated in FIG. 5A.

Subsequently, heavily doped n-type source/drain regions 48a and heavily doped p-type source/drain regions 48b are successively formed in the surface portion of the p-type single crystal silicon substrate 41 and the n-type well 42 in a self-aligned manner with the gate electrodes 45a and 45b by using the lithographic technique and the ion-implantation, and the gate electrodes 45a and 45b are heavily doped with the n-type dopant impurity and the p-type dopant impurity, respectively. For this reason, the gate electrodes 45a and 45b are hereinbelow called as "n-type polysilicon gate electrode" and "p-type polysilicon gate electrode". Arsenic or phosphorus is used as the n-type dopant impurity for the heavily doped n-type source/drain regions 48a and the n-type polysilicon gate electrode 45a.

After the ion-implantation, the p-type single crystal silicon substrate 41 is placed in nitrogen atmosphere at 900 degrees centigrade for 20 minutes so as to activate the implanted dopant impurities and cure the crystal from damages due to the ion-implantation. As the result, the LDD-structure is realized in the surface portion of the p-type single crystal silicon substrate 41 and the n-type well 42.

Subsequently, arsenic ion is implanted at dose of $3.0 \times 10^{14}$ $cm^{-2}$ under acceleration energy of 30 KeV, and forms amorphous silicon layers 49a, 49b and 49c of 30 nanometers deep on the heavily doped n-type source/drain regions 48a, the heavily doped p-type source/drain regions 48b and the gate electrodes 45a/45b. $BF_2$ is available for the ion-implantation instead of the arsenic ion. The heavy element is desirable for forming the amorphous layers 49a, 49b, 49c and 49d.

Natural oxide is etched away from the exposed single crystal silicon surfaces and the exposed polysilicon gate electrodes 45a/45b in dilute hydrofluoric acid.

Subsequently, the p-type single crystal silicon substrate 41 is placed in vacuum, and is heated to 450 degrees for 10 minutes. The excess arsenic or the excess phosphorus was piled on the heavily doped n-type source/drain regions 48a and the n-type polysilicon gate electrode 45a, and the piles of arsenic/phosphorus are partially sublimated in the high temperature vacuum.

Arsenic, phosphorus and boron are sublimated at 615 degrees centigrade, 280 degrees centigrade and 2550 degrees centigrade. However, it is necessary to carry out the sublimation at a lower temperature than the crystallization temperature of silicon. If the arsenic and the phosphorus are heated around 500 degrees centigrade in vacuum, the arsenic and the phosphorus have respective vapor pressures of 0.1 atm and 1 atm, and the sublimation in vacuum is effective against the piles of the n-type impurity.

Figure 5B:
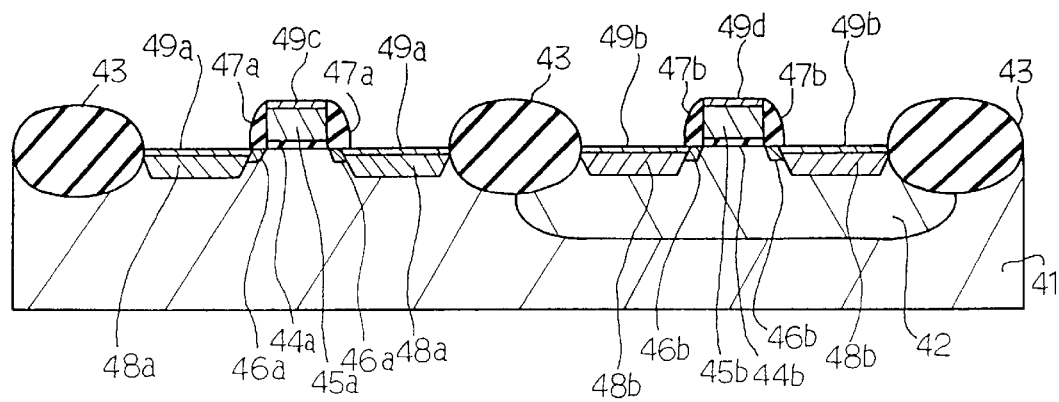
Figure 5C:
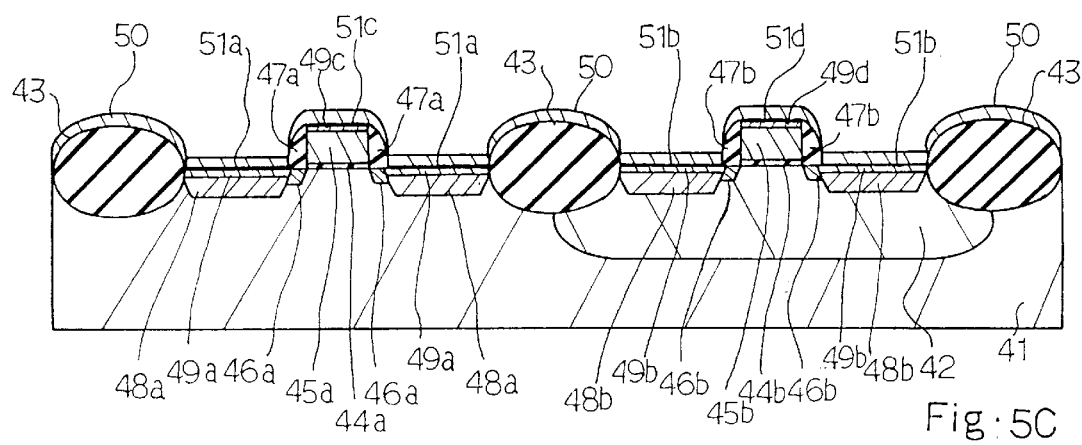

After the sublimation in the high temperature vacuum, the n-type amorphous silicon layers 49a and 49c and the p-type amorphous silicon layers 49b and 49d are left on the heavily doped n-type source/drain regions 48a, the n-type polysilicon gate electrode 45a and the heavily doped p-type source/drain regions 48b as shown in FIG. 5B.

The p-type single crystal silicon substrate 41 is still maintained in the vacuum, and titanium is sputtered to 30 nanometers thick on the entire surface of the structure. While the titanium is being sputtered, the p-type single crystal silicon substrate 41 is maintained at 450 degrees centigrade, and mixed boundary layers of amorphous silicon and titanium 51a, 51b, 51c and 51d are formed in the amorphous silicon layers 49a to 49d. The mixed boundary layers 51a to 51d are of the order of 6 nanometer in depth, and are represented by thick real lines in FIG. 5C.

Figure 5D:
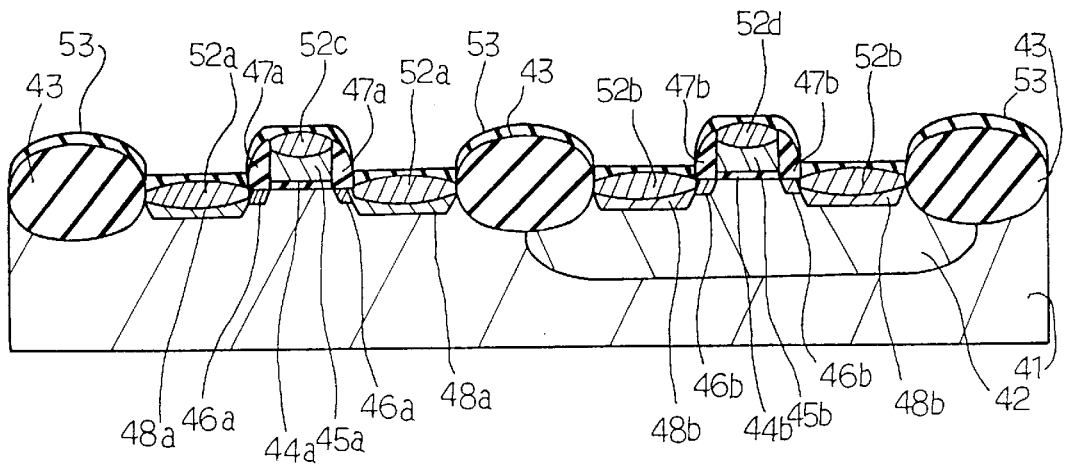

Subsequently, the titanium layer 50 is subjected to a rapid thermal annealing in the nitrogen atmosphere at 650 degrees centigrade for 30 seconds. Parts of the titanium layer 50 held in contact with single-crystal/poly-crystal silicon are converted to titanium disilicide layers 52a, 52b, 52c and 52d, and the titanium exposed to the nitrogen converted to titanium nitride 53 as shown in FIG. 5D.

After the silicidation, the titanium nitride 53 and non-reacted titanium are etched away in an etchant containing ammonia and hydrogen peroxide, and the titanium disilicide layers 52a to 52d are left on the heavily doped n-type source/drain regions 48a, the heavily doped p-type source/drain regions 48b, the n-type polysilicon gate electrode 45a and the p-type polysilicon gate electrode 45b.

Figure 5E:
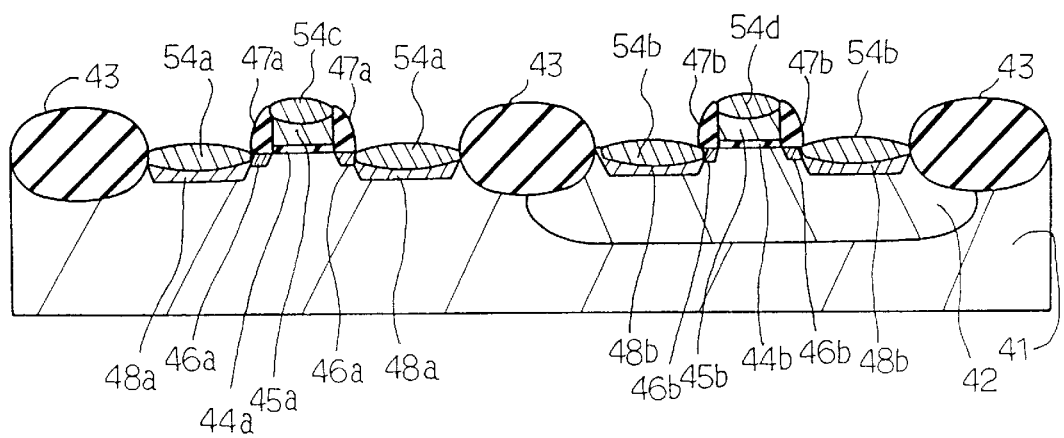

The titanium disilicide layers 52a to 52d are subjected to a rapid thermal annealing in the nitrogen atmosphere at 850 degrees centigrade for 10 seconds, and the high-resistive titanium disilicide layers 52a to 52d are phase transferred to low-resistive titanium disilicide layers 54a, 54b, 54c and 54d as shown in FIG. 5E.

The present inventor evaluated the titanium disilicide layers 54a to 54d by measuring the sheet resistance. The sheet resistance was 5.8 ohm per square on the heavily doped n-type source/drain regions 48a, 5 ohm per square on the heavily doped p-type source/drain regions 48b, 4.7 ohm per square on the n-type polysilicon gate electrode 45a and 4.1 ohm per square on the p-type polysilicon gate electrode 45b.

Comparing the sheet resistances with those of the first embodiment, it is understood that the titanium disilicide on the n-type layer/region are lowered in sheet resistance, and the difference between the n-type impurity and the p-type impurity is further decreased. Thus, the sublimation in high temperature vacuum is effective against the piles of n-type dopant impurity.

The amorphous silicon layers 51a and 51c not only promote the silicidation but also allows the piles of the n-type dopant impurity to be easily sublimated.

In a modification, the amorphous silicon layers 51a to 51d may be formed through a reverse sputtering with argon ion. If the p-type single crystal silicon substrate 41 is subjected to the reverse sputtering with the argon ion in high temperature atmosphere at 450 degrees centigrade, the formation of amorphous silicon and the sublimation of piles of n-type impurity concurrently proceed.

Other metals may be used instead of the titanium as similar to the first embodiment.

Third Embodiment

FIGS. 6A to 6E illustrate yet another process embodying the present invention. The process starts with preparation of a p-type single crystal silicon substrate 61, and an n-type well 62 is formed through an ion-implantation. The n-type well 62 is assigned to a p-channel type field effect transistor.

A field oxide layer 63 is selectively grown on the surface of the p-type single crystal silicon substrate 61 to 360 nanometers thick, and a surface portion of the p-type single crystal silicon substrate 61 is assigned to an n-channel type field effect transistor.

Gate insulating layers 64a and 64b of silicon oxide are grown on the exposed surfaces to 10 nanometer thick, and polysilicon is deposited over the entire surface of the structure to 150 nanometers thick. The polysilicon layer is patterned to gate electrodes 65a and 65b by using lithographic techniques and a dry etching technique.

N-type lightly doped source/drain regions 66a and p-type lightly doped source/drain regions 66b are successively formed in the surface portion of the p-type single crystal silicon substrate 61 and the n-type well 62 in a self-aligned manner with the gate electrodes 65a and 65b by using the lithographic techniques and the ion-implantation.

Figure 6A:
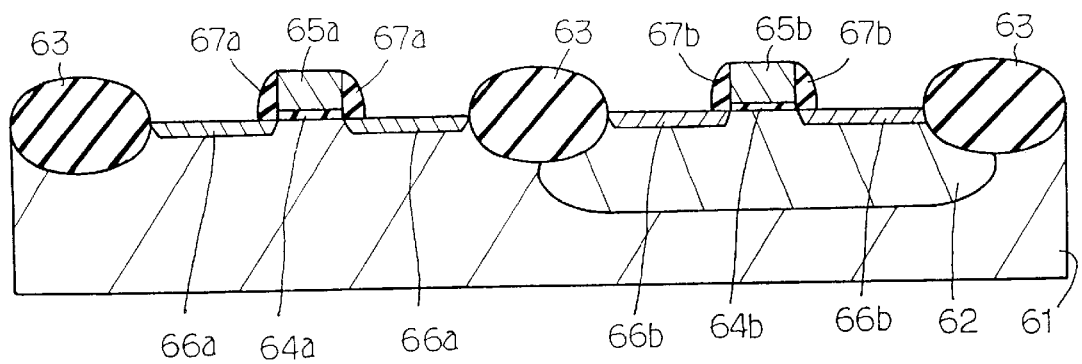
FIGS. 6A to 6E are cross sectional views showing yet another process sequence according to the present invention.

Silicon oxide is deposited to 70 nanometers thick over the entire surface of the structure, and the silicon oxide layer is formed into side walls 67a and 67b on the side surfaces of the gate electrodes 65a and 65b by using an etch-back technique. The resultant structure is illustrated in FIG. 6A.

Subsequently, heavily doped n-type source/drain regions 68a and heavily doped p-type source/drain regions 68b are successively formed in the surface portion of the p-type single crystal silicon substrate 61 and the n-type well 62 in a self-aligned manner with the gate electrodes 65a and 65b by using the lithographic technique and the ion-implantation, and the gate electrodes 65a and 65b are heavily doped with the n-type dopant impurity and the p-type dopant impurity, respectively. For this reason, the gate electrodes 65a and 65b are hereinbelow called as "n-type polysilicon gate electrode" and "p-type polysilicon gate electrode", respectively. Arsenic or phosphorus is used as the n-type dopant impurity for the heavily doped n-type source/drain regions 68a and the n-type polysilicon gate electrode 65a.

After the ion-implantation, the p-type single crystal silicon substrate 41 is placed in nitrogen atmosphere at 900 degrees centigrade for 20 minutes so as to activate the implanted dopant impurities and cure the crystal from damages due to the ion-implantation. As the result, the LDD-structure is realized in the surface portion of the p-type single crystal silicon substrate 61 and the n-type well 62.

Figure 6B:
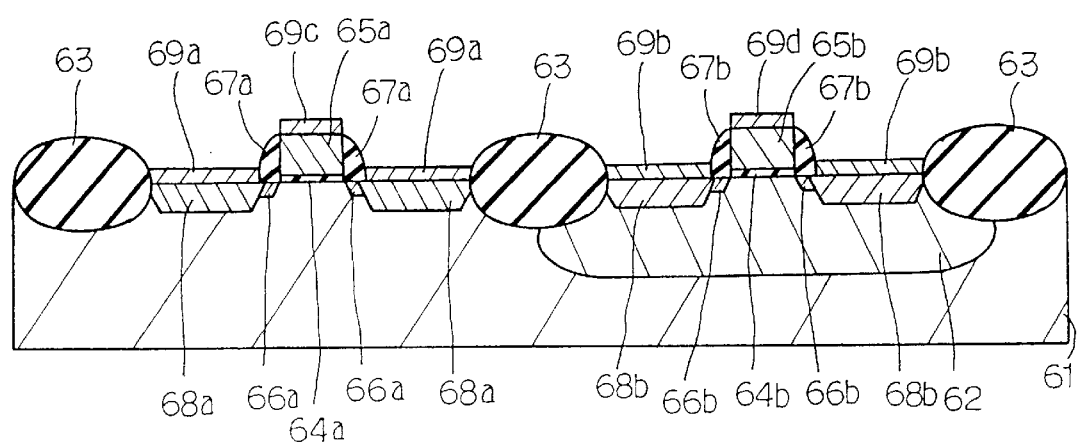

Subsequently, polysilicon is selectively grown over the heavily doped n-type source/drain regions 68a, the heavily doped p-type source/drain regions 68b and the n-type/p-type polysilicon gate electrodes 65a/65b to 30 nanometers thick through a chemical vapor deposition, and the heavily doped n-type source/drain regions 68a, the heavily doped p-type source/drain regions 68b and the n-type/p-type polysilicon gate electrodes are overlain by polysilicon layers. Arsenic ion is implanted at dose of $3.0 \times 10^{14}$ $cm^{-2}$ under acceleration energy of 30 KeV, and converts the polysilicon layers to amorphous silicon layers 69a, 69b and 69c as shown in FIG. 6B. $BF_2$ is available for the ion-implantation instead of the arsenic ion. The heavy element is desirable for forming the amorphous layers 69a, 69b, 69c and 69d.

Natural oxide is etched away from the exposed single crystal silicon surfaces and the exposed polysilicon gate electrodes 65a/65b in dilute hydrofluoric acid.

Figure 6C:
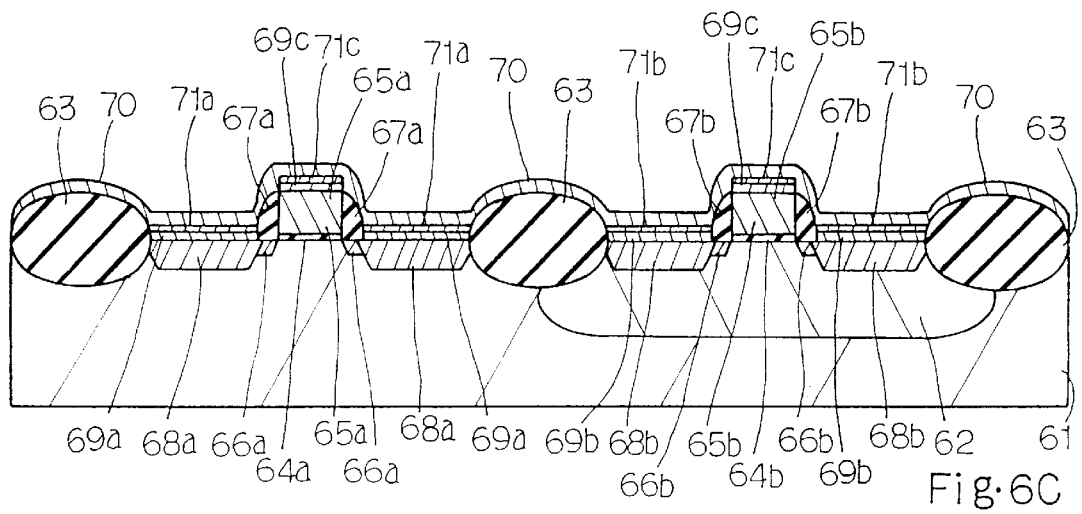

Titanium 70 is sputtered on the entire surface of the structure to 30 nanometers thick. While the titanium is being sputtered, the p-type single crystal silicon substrate 61 is maintained at 450 degrees centigrade, and mixed boundary layers of amorphous silicon and titanium 71a, 71b, 71c and 71d are formed in the amorphous silicon layers 69a to 69d. The mixed boundary layers 71a to 71d are of the order of 6 nanometer in depth, and the resultant structure is illustrated in FIG. 6C.

Figure 6D:
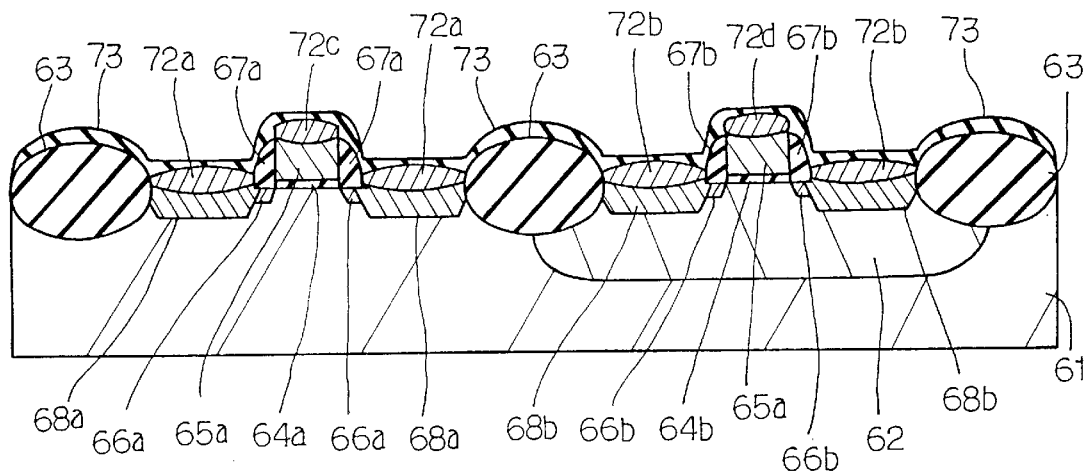

Subsequently, the titanium layer 70 is subjected to a rapid thermal annealing in the nitrogen atmosphere at 650 degrees centigrade for 30 seconds. Parts of the titanium layer 70 held in contact with single-crystal/poly-crystal silicon are converted to titanium disilicide layers 72a, 72b, 72c and 72d, and the titanium exposed to the nitrogen is converted to titanium nitride 73 as shown in FIG. 6D.

After the silicidation, the titanium nitride 73 and non-reacted titanium are etched away in an etchant containing ammonia and hydrogen peroxide, and the titanium disilicide layers 72a to 72d are left on the heavily doped n-type source/drain regions 68a, the heavily doped p-type source/drain regions 68b, the n-type polysilicon gate electrode 65a and the p-type polysilicon gate electrode 65b.

Figure 6E:
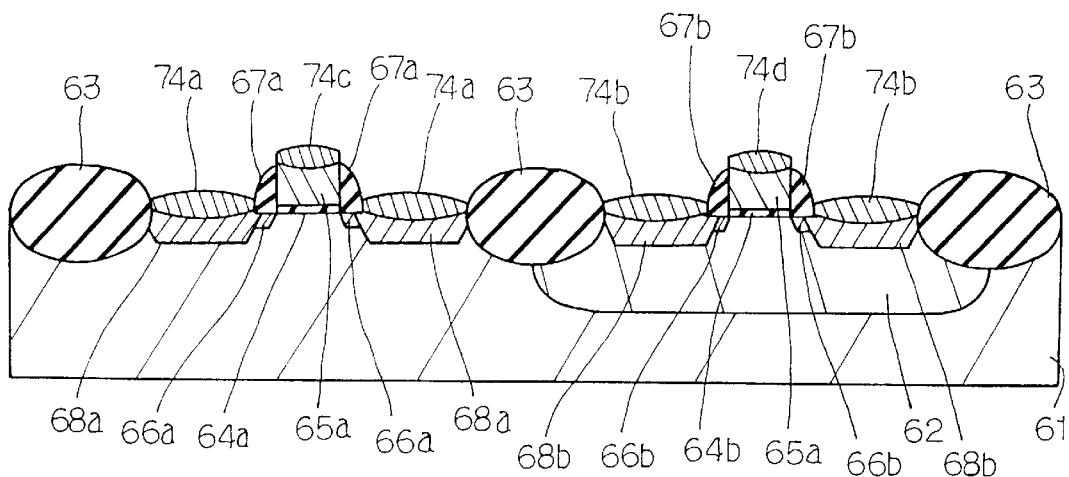

The titanium disilicide layers 72a to 72d are subjected to a rapid thermal annealing in the nitrogen atmosphere at 850 degrees centigrade for 10 seconds, and the high-resistive titanium disilicide layers 72a to 72d are phase transferred to low-resistive titanium disilicide layers 74a, 74b, 74c and 74d as shown in FIG. 6E.

Thus, the titanium disilicide layers 74a to 74d are selectively produced on the heavily doped n-type source/drain regions 68a, the heavily doped p-type source/drain regions 68b, the n-type polysilicon gate electrode 65a and the p-type polysilicon gate electrode 65b, and are roughly equal in thickness to one another. A short-circuit does not take place between the gate electrodes 45a/45b and the heavily doped n-type/p-type source and drain regions 68a/68b. The resistivity of the titanium disilicide layers 74a to 74d is so low that signal paths can rapidly propagate electric signals.

Although the polysilicon layers are converted to the amorphous silicon layers 69a to 69d through the ion implantation. However, amorphous silicon may be directly grown on the heavily doped n-type source/drain regions 68a, the heavily doped p-type source/drain regions 68b, the n-type polysilicon gate electrode 45a and the p-type polysilicon gate electrode 45b through a chemical vapor deposition.

Moreover, the ion implantations for the heavily doped n-type/p-type source and drain regions 48a/48b may be carried out after the growth of the polysilicon layers through the chemical vapor deposition.

Other metals may be used instead of the titanium as similar to the first embodiment.

Although particular embodiments of the present invention have been shown and described, it will be obvious to those skilled in the art that various changes and modifications may be made without departing from the spirit and scope of the present invention. For example, the refractory disilicide layer may be incorporated in another semiconductor device such as, for example, a bipolar transistor.

What is claimed is:

1. A process of producing titanium disilicide layers, comprising the steps of:
   a) preparing a semiconductor structure having a first silicon portion doped with a p-type impurity and a second silicon portion doped with an n-type impurity;
   b) forming amorphous silicon layers on said first silicon portion and said second silicon portion;
   c) sputtering a titanium layer on at least said amorphous silicon layers while maintaining said semiconductor structure at a first temperature above all normal ambient temperatures and lower than a second temperature and a third temperature, said second temperature being for producing a titanium disilicide and said third temperature being for crystallizing said amorphous silicon layers, whereby said titanium and said amorphous silicon form mixed amorphous silicon/titanium boundary layers between said first and second silicon portions and said titanium layer, wherein said mixed amorphous silicon/titanium boundary layers trap dopant impurities which are present in said first and second silicon portions in excess of the respective solubility levels of said first and second silicon portions within said mixed amorphous silicon/titanium boundary layers, and further wherein said mixed amorphous silicon/titanium boundary layers are about 6 nanometers in thickness; and
   d) heating said titanium layer to a fourth temperature not lower than said second temperature and said third temperature for producing titanium disilicide layers on said first and second silicon portions,
   in which said step b) includes the sub-steps of
      b-1) covering said first silicon portion and said second silicon portion with polysilicon layers, respectively, and
      b-2) implanting an ion into said polysilicon layers, for converting said polysilicon layers into said amorphous layers; and
   in which said first temperature in step c) is between 300° centigrade to 500° centigrade.

2. A process of producing titanium disilicide layers, comprising the steps of:
   a) preparing a semiconductor structure having a first silicon portion doped with a p-type impurity and a second silicon portion doped with an n-type impurity;
   b) forming amorphous silicon layers on said first silicon portion and said second silicon portion;
   c) sputtering a titanium layer on at least said amorphous silicon layers while maintaining said semiconductor structure at a first temperature above all normal ambient temperatures and lower than a second temperature and a third temperature, said second temperature being for producing a titanium disilicide and said third temperature being for crystallizing said amorphous silicon layers, whereby said titanium and said amorphous silicon form mixed amorphous silicon/titanium boundary layers between said first and second silicon portions and said titanium layer, wherein said mixed amorphous silicon/titanium boundary layers trap dopant impurities which are present in said first and second silicon portions in excess of the respective solubility levels of said first and second silicon portions within said mixed amorphous silicon/titanium boundary layers, and further wherein said mixed amorphous silicon/titanium boundary layers are about 6 nanometers in thickness; and
   d) heating said titanium layer to a fourth temperature not lower than said second temperature and said third temperature for producing titanium disilicide layers on said first and second silicon portions,
   in which said amorphous silicon layers are deposited on at least said first silicon portion and said second silicon portion through a chemical vapor deposition; and
   in which said first temperature in step c) is between 300° centigrade to 500° centigrade.

3. A process of producing refractory metal disilicide layers, comprising the steps of:
   a) preparing a semiconductor structure having a first silicon portion doped with a p-type impurity and a second silicon portion doped with an n-type impurity;

b) forming amorphous silicon layers on said first silicon portion and said second silicon portion;

c) depositing a refractory metal layer on at least said amorphous silicon layers while maintaining said semiconductor structure at a first temperature above all normal ambient temperatures and lower than a second temperature and a third temperature, said second temperature being for producing a refractory metal disilicide and said third temperature being for crystallizing said amorphous silicon layers, whereby said refractory metal and said amorphous silicon form mixed amorphous silicon/refractory metal boundary layers between said first and second silicon portions and said refractory metal layer, wherein said mixed amorphous silicon/titanium boundary layers trap dopant impurities which are present in said first and second silicon portions in excess of the respective solubility levels of said first and second silicon portions within said mixed amorphous silicon/titanium boundary layers, and further wherein said mixed amorphous silicon/titanium boundary layers are of approximately equal thickness to said dopant impurities which are present in said first and second silicon portions in excess of the respective solubility levels of said first and second silicon portions; and d) heating said refractory metal layer to a fourth temperature not lower than said second temperature and said third temperature for producing refractory metal disilicide layers on said first and second silicon portions, in which said refractory metal is titanium, and said first temperature ranges from 300 degrees centigrade to 500 degrees centigrade.

4. A process of producing refractory metal disilicide layers, comprising the steps of:

a) preparing a semiconductor structure having a first silicon portion doped with a p-type impurity and a second silicon portion doped with an n-type impurity;

b) forming amorphous silicon layers on said first silicon portion and said second silicon portion;

c) depositing a refractory metal layer on at least said amorphous silicon layers while maintaining said semiconductor structure at a first temperature above all normal ambient temperatures and lower than a second temperature and a third temperature, said second temperature being for producing a refractory metal disilicide and said third temperature being for crystallizing said amorphous silicon layers, whereby said refractory metal and said amorphous silicon form mixed amorphous silicon/refractory metal boundary layers between said first and second portions and said refractory metal layer; and d) heating said refractory metal layer to a fourth temperature not lower than said second temperature and said third temperature for producing refractory metal disilicide layers on said first and second silicon portions, further comprising the step of placing said semiconductor structure in a high temperature vacuum ambience for sublimating excess n-type impurity coagulated on a surface of said second silicon portion between said step a) and said step b).

5. The process as set forth in claim 4, in which said refractory metal is titanium, and the sublimation of said excess n-type impurity is carried out at 450 degrees centigrade for 10 minutes.

6. A process of fabricating a semiconductor device on a single crystal silicon substrate, comprising the steps of:

preparing a semiconductor structure having an n-type single crystal silicon region of said single crystal silicon substrate, a p-type single crystal silicon region of said single crystal silicon substrate, all n-type polysilicon layer over said single crystal silicon substrate, a p-type polysilicon layer over said single crystal silicon substrate and side walls of silicon oxide provided on side surfaces of said n-type and p-type polysilicon layers;

covering an exposed surface of said n-type single crystal silicon region, an exposed surface of said p-type single crystal silicon region, an exposed surface of said n-type polysilicon layer and an exposed surface of said p-type polysilicon layer with amorphous silicon layers;

heating said semiconductor structure to a first temperature higher than an ambient temperature and lower than a second temperature and a third temperature, said second temperature being for silicidation of titanium and said third temperature being for crystallization of the amorphous silicon, and wherein said first temperature is between 300° centigrade to 500° centigrade;

sputtering a titanium layer on an entire surface at said first temperature so as to contact said amorphous silicon layers and cover said side walls therewith, whereby said titanium layer and said amorphous silicon form mixed amorphous silicon/titanium boundary layers between said first and second silicon portions and said titanium layer, wherein said mixed amorphous silicon/titanium boundary layers trap dopant impurities which are present in said first and second silicon portions in excess of the respective solubility levels of said first and second silicon portions within said mixed amorphous silicon/titanium boundary layers, and further wherein said mixed amorphous silicon/titanium boundary layers are greater than 5 nanometers in thickness; and converting parts of said titanium layer held in contact with said amorphous silicon into titanium disilicide layers; and removing portions of said titanium layer so as to leave said titanium disilicide layers on said n-type single crystal silicon region, said p-type single crystal silicon region, said n-type polysilicon layer and said p-type polysilicon layer.

7. A process of producing titanium disilicide layers, comprising the steps of:

preparing a semiconductor structure having a first silicon portion doped with a p-type impurity and a second silicon portion doped with an n-type impurity;

forming amorphous silicon layers on said first silicon portion and said second silicon portion;

sputtering a titanium layer on at least said amorphous silicon layers at a first temperature ranges from 300° centigrade to 500° centigrade, such that said first temperature is sufficient to cause a phase C54 titanium disilicide structure to form when said titanium layer is annealed, where said first temperature is lower than a second temperature for producing a titanium disilicide and a third temperature for crystallizing said amorphous silicon layers, whereby said titanium layer and said amorphous silicon form mixed amorphous silicon/titanium boundary layers between said first and second silicon portions and said titanium layer, wherein said mixed amorphous silicon/titanium boundary layers trap dopant impurities which are present in said first and second silicon portions in excess of the respective solubility levels of said first and second silicon portions within said mixed amorphous silicon/titanium boundary layers, and further wherein said mixed amorphous silicon/titanium boundary layers are greater than 5 nanometers in thickness; and heating said titanium layer to a fourth temperature, not lower than said second temperature and said third temperature, for annealing to produce said phase C54 titanium disilicide layers on said first and second silicon portions.

8. The process as set forth in claim 7, in which said heating step is performed in a nitrogen atmosphere.

9. The process as set forth in claim 8, further including the step of removing portions of said titanium layer so as to leave said titanium disilicide layers on said first and second silicon portions.

10. A process of producing a titanium disilicide layer, comprising the steps of:

forming an amorphous silicon layer on a silicon substrate;

sputtering a titanium metal layer on at least said doped amorphous silicon, with said silicon substrate temperature at a first temperature which is between 300 degrees centigrade and 500 degrees centigrade, whereby said refractory metal and said amorphous silicon form mixed amorphous silicon/refractory metal boundary layers between said first and second silicon portions and said refractory metal layer, wherein said mixed amorphous silicon/titanium boundary layers trap dopant impurities which are present in said first and second silicon portions in excess of the respective solubility levels of said first and second silicon portions within said mixed amorphous silicon/titanium boundary layers, and further wherein said mixed amorphous silicon/titanium boundary layers are of approximately equal thickness to said dopant impurities which are present in said first and second silicon portions in excess of the respective solubility levels of said first and second silicon portions; and heating said titanium metal layer to a temperature higher than said first temperature, sufficient to produce a titanium disilicide, and a second temperature, sufficient for crystallizing said amorphous silicon layer.

11. A process of producing titanium disilicide layers, comprising the steps of:

a) preparing a semiconductor structure having a first silicon portion doped with a p-type impurity and a second silicon portion doped with an n-type impurity;

b) forming amorphous silicon layers on said first silicon portion and said second silicon portion;

c) sputtering a titanium layer on at least said amorphous silicon layers while maintaining said semiconductor structure at a first temperature ranging from 300° centigrade to 500° centigrade which is lower than a second temperature and a third temperature, said second temperature being for producing a titanium disilicide and said third temperature being for crystallizing said amorphous silicon layers, whereby said titanium and said amorphous silicon form mixed amorphous silicon/titanium boundary layers between said first and second silicon portions and said titanium layer, wherein said mixed amorphous silicon/titanium boundary layers trap dopant impurities which are present in said first and second silicon portions in excess of the respective solubility levels of said first and second silicon portions within said mixed amorphous silicon/titanium boundary layers, and further wherein said mixed amorphous silicon/titanium boundary layers are of approximately equal thickness to said dopant impurities which are present in said first and second silicon portions in excess of the respective solubility levels of said first and second silicon portions; and d) heating said titanium layer to a fourth temperature not lower than said second temperature and said third temperature for producing titanium disilicide layers on said first and second silicon portions.

12. The process as set forth in claim 11, in which an ion is implanted into said first silicon portion and said second silicon portion so as to form said amorphous silicon layers.

13. The process as set forth in claim 11, in which said ion is produced from a substance selected from the group consisting of arsenic and boron difluoride.

14. The process as set forth in claim 12, in which said ion is formed from arsenic, and arsenic ion is implanted at a dose of $3.0 \times 10^{14}$ cm$^{-2}$ under an acceleration energy of 30 KeV.

15. The process as set forth in claim 11, in which said first silicon portion and said second silicon portion are subjected to a reverse sputtering using an inert gas so as to form said amorphous silicon layers.

16. The process as set forth in claim 15, in which said inert gas is argon.

17. The process as set forth in claim 11, in which said step b) includes the sub-steps of b-1) covering said first silicon portion and said second silicon portion with polysilicon layers, respectively, and b-2) implanting an ion into said polysilicon layers, for converting said polysilicon layers into said amorphous layers.

18. The process as set forth in claim 11, in which said titanium layer is covered with a protective layer preventing said titanium layer from a reaction with a substance except for the silicon.

19. The process as set forth in claim 18, in which said protective layer is formed of titanium nitride.

20. The process as set forth in claim 18, further comprising the step of removing said protective layer and a residue of said titanium layer after said step d.

21. A process of producing titanium disilicide layers, comprising the steps of:

a) preparing a semiconductor structure having a first silicon portion doped with a p-type impurity and a second silicon portion doped with an n-type impurity;

b) forming amorphous silicon layers on said first silicon portion and said second silicon portion;

c) depositing a titanium layer on at least said amorphous silicon layers while maintaining said semiconductor structure at a first temperature above all normal ambient temperatures and lower than a second temperature and a third temperature, said second temperature being for producing a titanium disilicide and said third temperature being for crystallizing said amorphous silicon layers, whereby said titanium and said amorphous silicon form mixed amorphous silicon/titanium boundary layers between said first and second silicon portions and said titanium layer and wherein said mixed amorphous silicon/titanium boundary layers between said first and second portions and said titanium layer are of approximately equal thickness to said dopant impurities which are present in said first and second silicon portions in excess of the respective solubility levels of said first and second silicon portions d) trapping said dopant impurities which are present in said first and second silicon portions in excess of the respective solubility levels of said first and second silicon portions within said mixed amorphous silicon/titanium boundary layers between said first and second portions and said titanium layer; and e) heating said titanium layer to a fourth temperature not lower than said second temperature and said third temperature for producing titanium disilicide layers on said first and second silicon portions.

* * * * *